(12) United States Patent
Enquist et al.

(10) Patent No.: US 7,956,447 B2
(45) Date of Patent: Jun. 7, 2011

(54) WAFER SCALE DIE HANDLING

(75) Inventors: Paul M. Enquist, Cary, NC (US); Gaius G. Fountain, Jr., Youngsville, NC (US); Carl T. Petteway, Raleigh, NC (US)

(73) Assignee: Ziptronix, Inc., Morrisville, NC (US)

( * ) Notice: Subject to any disclaimer, the term of this patent is extended or adjusted under 35 U.S.C. 154(b) by 1901 days.

(21) Appl. No.: 10/792,757

(22) Filed: Mar. 5, 2004

(65) Prior Publication Data

US 2005/0194668 A1     Sep. 8, 2005

(51) Int. Cl.
*H01L 23/02* (2006.01)
(52) U.S. Cl. ......... 257/678; 414/935; 414/940; 414/941
(58) Field of Classification Search .................. 257/678; 414/935–941
See application file for complete search history.

(56) References Cited

U.S. PATENT DOCUMENTS

| | | | |
|---|---|---|---|
| 4,395,451 A * | 7/1983 | Althouse | 428/141 |
| 4,959,008 A | 9/1990 | Wasulko | |
| 4,980,971 A * | 1/1991 | Bartschat et al. | 29/833 |
| 5,597,074 A | 1/1997 | Ko | |
| 5,836,575 A | 11/1998 | Robinson et al. | |
| 5,971,698 A | 10/1999 | Dowling | |
| 5,983,468 A * | 11/1999 | Evans et al. | 24/457 |
| 2003/0075939 A1 | 4/2003 | Bendat et al. | |
| 2003/0124772 A1 | 7/2003 | Wright | |
| 2005/0000866 A1* | 1/2005 | Caparro et al. | 209/552 |

FOREIGN PATENT DOCUMENTS

| | | |
|---|---|---|
| JP | 04-014240 | 1/1992 |
| JP | 04-264751 | 9/1992 |
| JP | 06-216218 | 8/1994 |
| JP | 07-176511 | 7/1995 |
| JP | 07-254637 | 10/1995 |
| JP | 408335621 A * | 12/1996 |
| JP | 11-040658 | 2/1999 |
| JP | 11-307618 | 11/1999 |

OTHER PUBLICATIONS

Notice of Reasons for Rejection, issued in JP application 2007-501825, mailed Oct. 26, 2010.
Office Action issued Nov. 15, 2010, in Singapore Patent Application No. 2006060776.
Search Report issued Dec. 7, 2010 in EP Application No. 05713952.9.
Australian Examination Report dated Aug. 25, 2010.

* cited by examiner

*Primary Examiner* — Brook Kebede
(74) *Attorney, Agent, or Firm* — Oblon, Spivak, McClelland, Maier & Neustadt, L.L.P.

(57) ABSTRACT

A waffle pack device including a member having recesses in a surface of the member to accommodate die from at least one semiconductor wafer. The member is compatible with semiconductor wafer handling equipment and/or semiconductor wafer processing. Preferably, the member accommodates at least a majority of die from a semiconductor wafer. Further, one semiconductor device assembly method is provided which removes die from a singular waffle pack device, places die from the single waffle pack device on a semiconductor package to assemble from the placed die all die components required for an integrated circuit, and electrically interconnects the placed die in the semiconductor package to form the integrated circuit. Another semiconductor device assembly method is provided which removes die from at least one waffle pack device, places die from the at least one waffle pack device on a semiconductor package to assemble from the placed die device components required for an integrated circuit, and electrically interconnects the placed die in the semiconductor package to form the integrated circuit.

57 Claims, 9 Drawing Sheets

WAFER SCALE DIE HANDLING

BACKGROUND OF THE INVENTION

1. Field of the Invention

The present invention relates to the field of die handling, semiconductor packaging, assembly, multi-chip modules (MCM), and System-in-a-Package (SiP).

2. Description of the Related Art

One factor in reducing the cost of semiconductor fabrication is maximizing the number of semiconductor die on a semiconductor wafer. The advantage of increasing the number of die on a wafer is typically lost in the packaging or assembly processes of individual die because wafers need to be died and the individual die handled in order to sort good die and subsequently assemble the good die into a package.

A waffle pack is typically used to reduce the amount of individual die handling throughout the packaging process thereby achieving lower production cost and increased throughput. A waffle pack is a container typically with individual recesses to loosely restrict the movement of individual die within a recess and avoid the mixing of die between recesses. Various waffle packs have recesses typically made in various sizes and shapes to accommodate a various number of die and a variety of die sizes. The recesses are typically square, and the number of recesses is typically less than 50 and smaller than the number of die died from a semiconductor wafer. Waffle packs are frequently used to ship or store die after the die are died from a wafer and before they are packaged. Waffle packs are typically used in conjunction with automated pick-and-place tools that pick good die from the died wafers and place them in waffle packs. These pick-and-place tools are also used to pick die from waffle packs and place the die in semiconductor packages. Once loaded into the waffle pack, the die may also be covered with anti-static paper, and a lid is usually used to secure the waffle pack package together.

Consequently, during the assembly of multi-chip semiconductor packages, for example a multi-chip module (MCM) or a System-in-a-Package (SiP), die from different waffle packs are typically required as needed for the different chips of the multi-chip assembly. Although use of the waffle packs avoids handling of individual die throughout the packaging process, a large number of waffle packs is required to accommodate all of the die on a semiconductor wafer. Furthermore, for multi-chip semiconductor packages, a number of different waffle packs is typically required to provide for all the different type of die needed for the multi-chip semiconductor package being assembled. Conventional waffle packs are thus typically simple storage containers for die during intermediate steps in the packaging process.

SUMMARY OF THE INVENTION

The present invention is directed to a waffle pack device that can accommodate a greater number of die than a conventional waffle pack, is compatible with semiconductor wet and/or dry processes, and/or avoids front-side surface damage to the die.

One object of the present invention is to reduce the number of handling operations in a semiconductor assembly process.

A further object of the present invention is to increase the number of die that can be handled in a waffle pack.

A still further object of the present invention is to handle the majority of die that constitute a semiconductor wafer in a single waffle pack device. This capability results in reducing the number of handling steps required for a wafer-scale solution.

Indeed, another object of the present invention is to handle all die that constitute a semiconductor wafer in a single waffle pack device.

Still a further object of the present invention is to handle more die than constitute a single semiconductor wafer in a single waffle pack device.

Another object of the present invention is to provide a waffle pack device for processing single or multiple die in preparation for insertion into a semiconductor package.

A still further object of the present invention is to provide a waffle pack device for processing multiple die of different sizes and shapes.

Another object of the present invention is to provide a waffle pack device of similar dimensions and/or material as that a semiconductor wafer and thus is compatible with semiconductor wafer processing equipment.

A further object of the present invention is to provide a method and waffle pack device for handling die such that the die are restricted to move only a minimal amount in the waffle pack device during processing without the aid of an adherent.

Another object of the present invention is to provide a waffle pack device whereby die can be dropped from recesses in a member of the waffle pack device into recesses in an accompanying lid without contacting the die surface(s).

According to one aspect of the present invention, a waffle pack device includes a member having recesses in a surface of the member to accommodate die from at least one semiconductor wafer. The member is at least formed from a material and has a shape both of which are compatible with semiconductor wafer processing to permit the die in the waffle pack device to be processed in parallel. Preferably, the recesses in the waffle pack device can accommodate within the member a majority of die from a semiconductor wafer.

According to another aspect of the present invention, a semiconductor device assembly method is provided which removes die from a singular waffle pack device, places die from the single waffle pack device on a semiconductor package to assemble from placed die all device components required for an integrated circuit, and electrically interconnects the placed die in the semiconductor package to form the integrated circuit.

In still another aspect of the present invention, a semiconductor device assembly method is provided which removes die from at least one waffle pack device, places die from the at least one waffle pack device on a semiconductor package to assemble from placed die device components required for an integrated circuit, and electrically interconnects the placed die in the semiconductor package to form the integrated circuit.

BRIEF DESCRIPTION OF THE DRAWING

A more complete appreciation of the present invention and many attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1A:
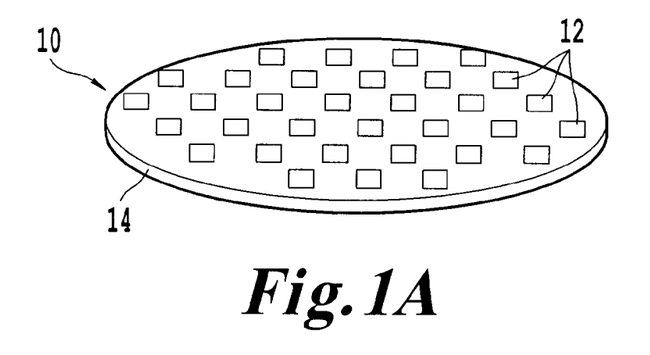
FIG. 1A is a schematic of a one embodiment of the invention showing a waffle pack device having recesses sized for a specific range of die size.

Referring now to the drawings, wherein like reference numerals designate like or corresponding parts throughout the several views, and more particularly to FIG. 1A illustrating a first embodiment of the present invention is described. FIG. 1A shows a waffle pack device 10 having recesses 12 formed in a member or a carrier 14. The member 14 preferably has a sufficient number of recesses 12 such that at least a majority of die from a died semiconductor wafer can be accommodated by the member 14. The member 14 is formed from a material, and has a size and shape which are compatible with semiconductor wafer processing (i.e. compatible with semiconductor handling equipment and/or semiconductor wafer processes) to permit the die in the waffle pack device 10 to be processed in parallel. For example, the member 14 can be round (e.g. a circular disk) and of a diameter that approximates a semiconductor wafer diameter to permit compatibility with semiconductor wafer handling equipment.

Further, the member 14 is preferably made of a semiconductor-process-compatible material to permit compatibility with semiconductor wet or dry processing. Various semiconductor-process-compatible materials applicable in the present invention for use as the waffle pack device include semiconductor, silicon oxide, silicon nitride, Al, Cu, W, and silicides. Other semiconductor-process-compatible materials include stainless steel, titanium, altem, kapton, teflon, polypropylene and $Al_2O_3$. Some of these semiconductor-process-compatible materials, according to one embodiment of the present invention, can also be coated with silicon oxide or silicon nitride. The thickness of the member 14 is preferably chosen to be thick enough to accommodate the thickness of the recesses and not to deform when handled. The thickness depends on the depth and number of recesses, the size or diameter of the host, and the material from which the host is made. For example, for a member 14 made of nitride coated aluminum of 200 mm diameter and with 100-1000 recesses each 0.2 mm deep, a member thickness would preferably be 3-10 mm. Furthermore, for a member 14 made of silicon of 100, 200, or 300 mm diameter and with 100-1000 recesses each 0.2 mm deep, a member thickness would preferably be 0.5-1.0 mm.

If the member 14 is constructed primarily of a silicon, one method of fabricating the waffle pack device 10 according to the present invention utilizes photolithography and etching. The waffle pack device 10 can be for example a silicon-on-insulator (SOI) type structure. An example of a SOI structure suitable for the present invention includes a first silicon member, a silicon oxide layer, and a second silicon member stack. The first silicon member thickness is thick enough for mechanical handling stability. The silicon oxide layer thickness provides etch selectivity. The second silicon member thickness provides the desired recess depth.

Fabrication of this structure can use standard photolithographic techniques such as, for example, a silicon via etch to selectively etch through the second silicon member to the silicon oxide layer to form the recesses 12. In one illustrative example of a SOI structure suitable for the present invention, the first silicon member has a thickness of 0.5-1.0 mm (such as for example the thickness of a standard 200 mm Si wafer), the silicon oxide layer thickness has a thickness of 1-10 microns (formed for example by oxidation or chemical vapor deposition), and the second silicon member has a thickness of 50-500 microns (formed for example by bonding and thinning a standard silicon wafer). Besides standard photolithographic techniques, machining techniques can used to form the structures of the present invention. The choice of fabrication technique will to some degree depend upon the host material of the member 14.

Figure 1B:
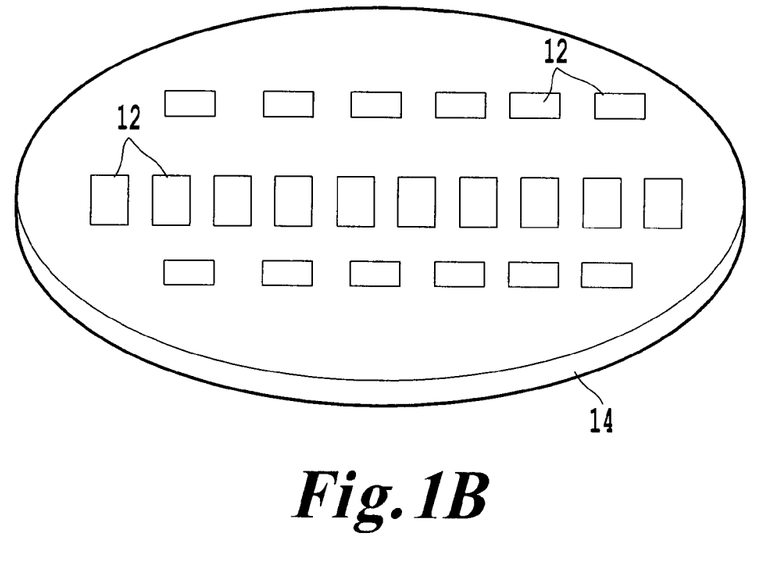
FIG. 1B is a schematic of a another embodiment of the invention with showing a waffle pack device having recesses sized for different sizes of die.

The recesses 12 in the member 14 are preferably sized to hold the die. The number of recesses can exceed 50 and can exceed a few thousand die (e.g. 1,000-5,000 or greater depending on the die size). The recesses are preferably made to a tolerance to accommodate a die of a specific size, e.g., the recesses 12 are preferably sized to be from 0.05 to 0.5 mm larger in dimension than the die 18. Similarly, the depth of the recesses 12 range is typically up to 05 mm larger or smaller than a thickness of the die 18. For example, for a 7 mm×7 mm die, 0.3 mm thick, a 7.1 mm×7.1 mm+/−0.05 mm recess, 0.25 mm+/−0.0.25 mm deep may be used. Moreover, the recesses can be sized differently to accommodate die of different sizes and shapes, as illustrated in FIG. 1B.

Figures 2A, 2B:
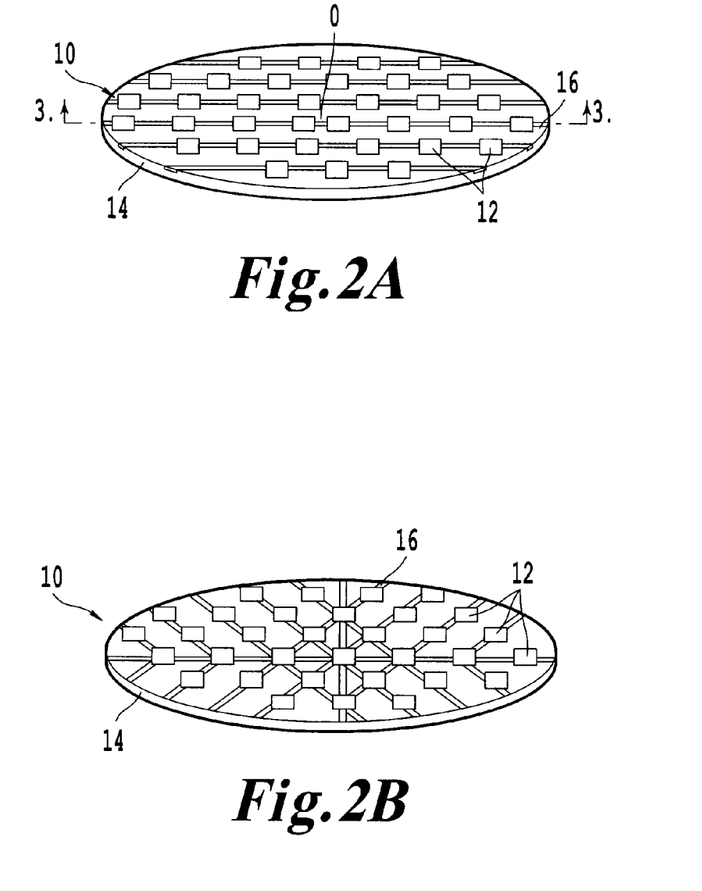
FIG. 2A is a schematic top view of another embodiment of the invention showing a waffle pack device having channels intersecting the recesses for directing effluent from the waffle pack device.
FIG. 2B is a schematic top view of another embodiment of the invention showing a waffle pack device having the channels disposed radially.

As shown in FIG. 2A, channels 16 can be included that connect the recesses 12 together to provide a path such that liquid effluent can be directed away from the die 18 during wet processing and/or subsequent drying. The channels 16 are preferably large enough to accommodate the effluent, but small enough not to adversely impact the movement of the die within the recesses 12. A preferable range of channel width is 0.5 to 5.0 mm. As shown in FIG. 2A, the channels for a circular member can be disposed along chords of the circular member. In another embodiment of the present invention, the channels can be disposed radially or a combination of radial and linear components, as shown in FIG. 2B.

Figure 3A:
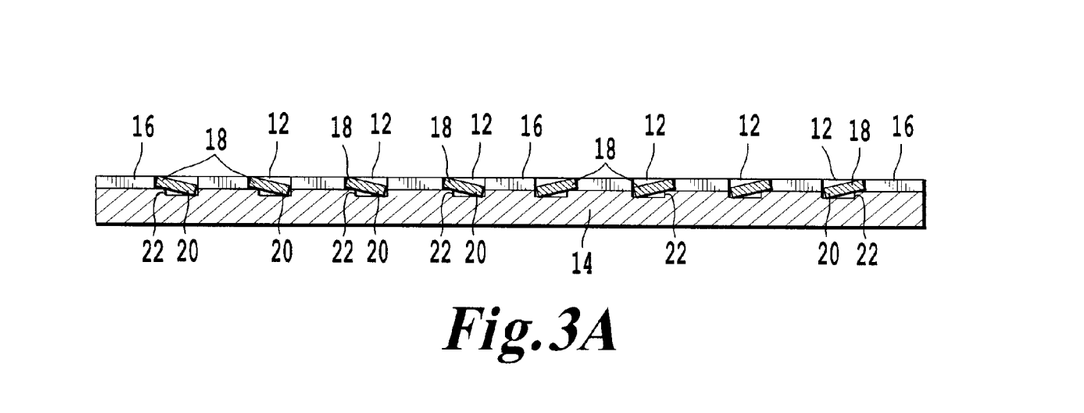
FIG. 3A is a schematic cross sectional view of the embodiment in FIG. 2A showing a section of a waffle pack device of the present invention about a region of the recesses.

FIG. 3A is a schematic cross sectional view of the embodiment in FIG. 2A showing a section of a waffle pack device of the present invention about a region of the recesses. As shown in FIG. 3A, the recesses 12 may be further constructed so that die 18 do not lie flat in a bottom 20 of the recesses 12, but rather are tilted with a normal axis that has a radial component toward a center-of-mass normal axis of the member 14. As such, the ejection of die 18 from recesses 12 during spinning of the member 14 is mitigated. The tilt can be achieved for example by a ledge 22 on the bottom 20 toward a side of the recess 12 away from the center of the member 14. The lateral width of ledge 22 is small compared to the recess lateral dimension containing the ledge and can be formed. For a recess of 7.1 mm×7.1 mm as discussed above, the lateral width of the ledge is typically less than 1 mm. The tilt of the die 18 in the recess 12 is thus determined by the shape and size of the ledge formed in the bottom 20 of the recess 12. The ledge as shown in FIG. 3A along a center line can tilt the die in opposite directions. However, the present invention is not limited to this exact configuration. Pragmatic considerations involved in setting up and programming automatic machine equipment to fabricate the recesses, ledges, and channels may result in groups of the recesses not having the same tilt configuration that is shown in FIG. 3A.

Figure 3B:
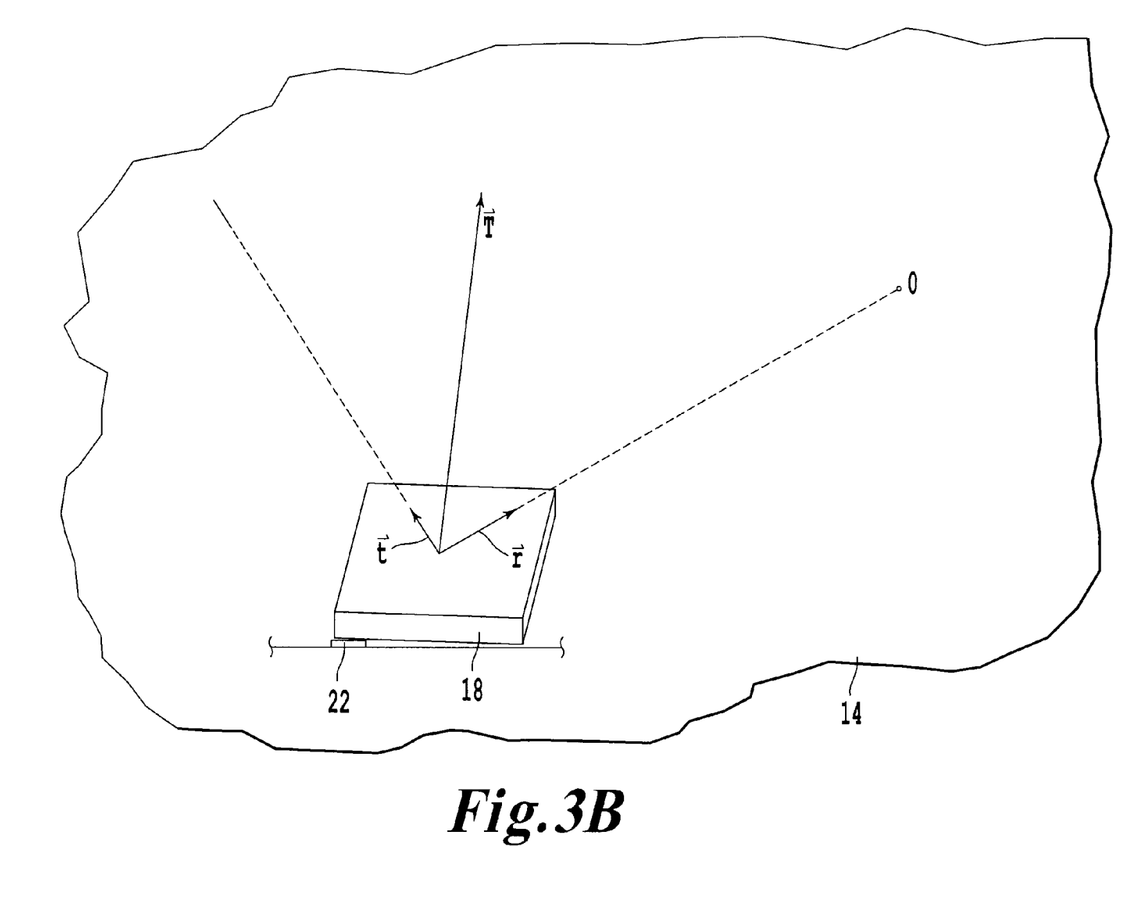
FIG. 3B is a perspective view showing die placed in the recesses of the waffle pack device illustrating the radial and tangential orientation of the die with respect to the center of mass of the waffle pack device.

For example, during forming the recesses 12 and the ledges 22, typically the circular member as shown in FIG. 1A is arbitrarily segmented into a number of sections, for example quadrants, for the purpose of setting up the machine tool to machine the recesses 12 and the ledges 22. In each section, the recesses and ledges will be similarly aligned. In this situation, in reference to the center of mass or geometric center of the die in the waffle pack device, a tilt vector T of a die 18 as shown in FIG. 3B has not only a radial component r toward the center of mass or geometric center, but also has a tangential component t pointed along a direction tangential to the radius connecting the center of the die to the center of the waffle pack. In a preferred embodiment of the present invention, the radial component r of the tilt vector T is greater than the tangential component t to facilitate retention of the die in the recesses 12 during spinning.

Figure 4:
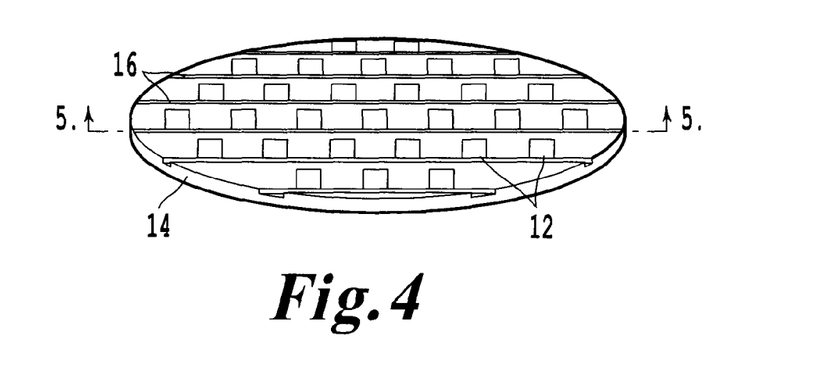
FIG. 4 is a schematic top view of another embodiment of the present invention showing a waffle pack device having channels intersecting the recesses along tangential edges of the recesses.
Figure 5A:
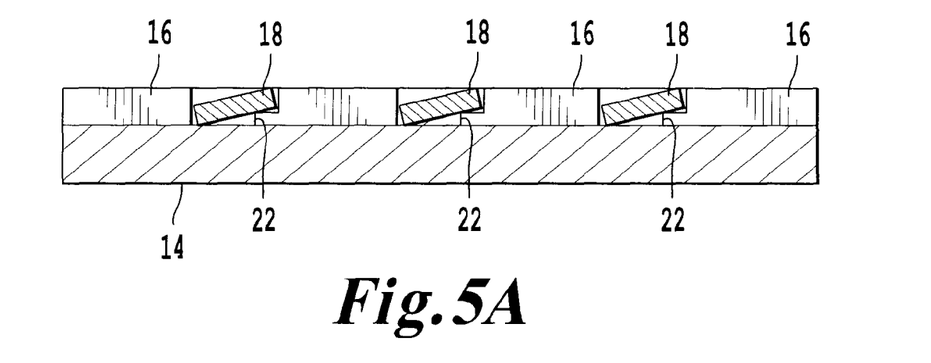
FIG. 5A is a schematic cross sectional view of the embodiment depicted in FIG. 4 having a bottom of the channel coincident with a bottom of the recess.
Figure 5B:
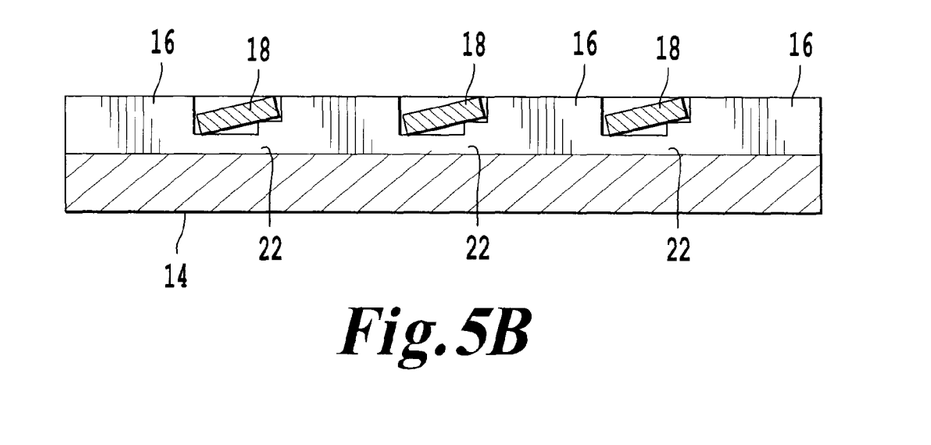
FIG. 5B is a schematic cross sectional view of the embodiment depicted in FIG. 4 having a bottom of the channel below a bottom of the recess.

Another embodiment of the waffle pack device of the present invention is shown in FIGS. 4 and 5A which show the location of the channels 16 running adjacent to the recesses 12. While the channels 16 in the member 14 as shown in FIG. 5A are at a depth the same as a bottom 20 of the recesses 12, the present invention is not limited to having the depths the same. Indeed, in one preferred embodiment of the present invention, the channels 16 are formed in the member 14 to a depth lower than the bottom 20 of the recesses 12, as shown in FIG. 5B. As such, liquid can drain from around the die when the die are subjected to wet processing while in the waffle pack device.

Figure 6A:
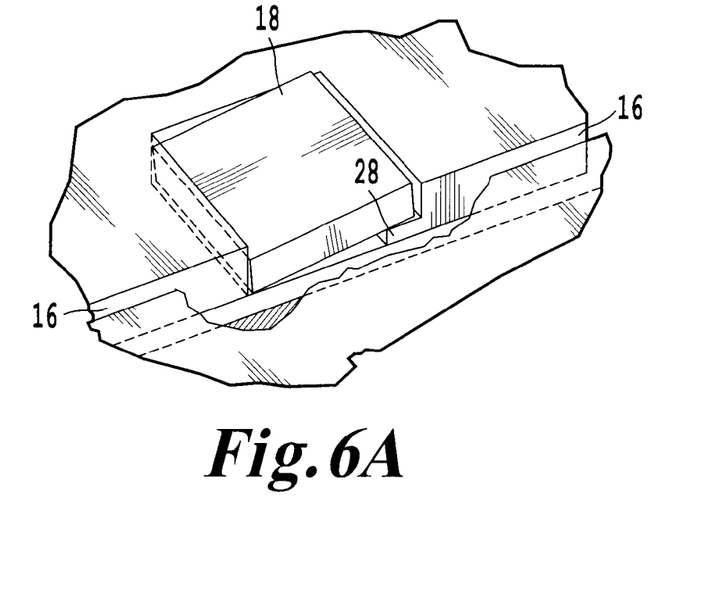
FIG. 6A is a schematic perspective view of the embodiment depicted in FIG. 4 about a region of the recesses.
Figure 6B:
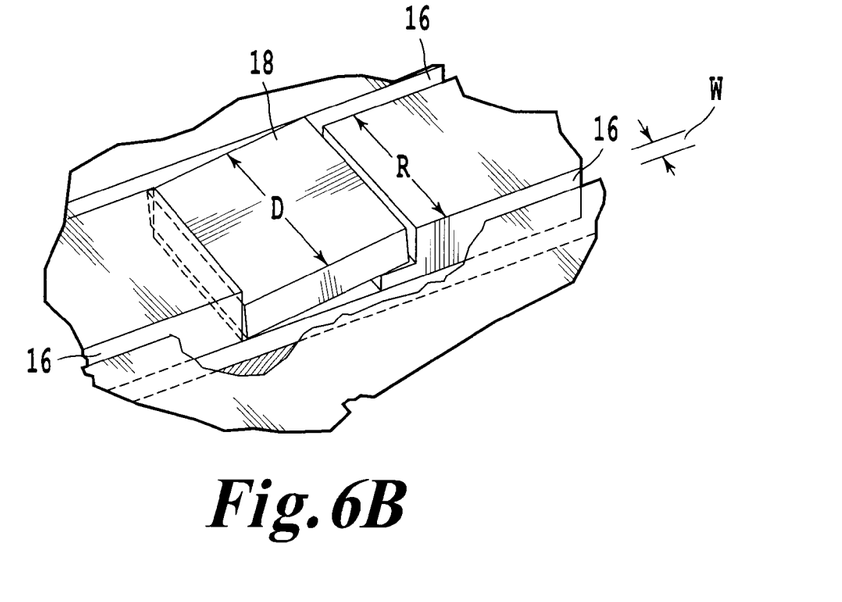
FIG. 6B is a schematic perspective view of the embodiment depicted in FIG. 4 about a region of the recesses in which each recess accesses two channels.

FIG. 6A is a schematic perspective view of the embodiment depicted in FIG. 4 about a region of the recesses. Liquid contained in the recesses 12 under the die 18 can flow into the channels 16 and be expelled from the recess during spinning. Further, while FIGS. 4 and 6A depict a configuration in which only one channel 16 is adjacent to a recess 12, in a preferred embodiment of the present invention, the waffle pack device of the present invention can have two channels 16 on opposite sides of the recess 12, as shown in FIG. 6B. Further, as can be seen in consideration with FIG. 6B, when the lateral size D of the die becomes smaller and is comparable to a width W of the channels 16, only a small amount of the remaining wall R remains by which the die 18 can be retained in the channels 16. For die that are less than 2-3 mm on a side and practical channel widths of 0.75 to 1 mm, the small size of the remaining wall R can result in the ejection of die 18 from the member 14 of the waffle pack device 10 when the waffle pack device 10 is spun at a high rate of speed, for example as is typically done in wet semiconductor processing. Consequently, securing the die in the recesses for example when spinning, can be problematic for small die sizes.

Normally, the small difference in size between the die 18 and the recesses 12 in the waffle pack device 10 allows the waffle pack device 10 to be rotated about an axis approximately normal to the waffle pack surface at very high speeds without losing the die 18. A recess sized ~0.1 to 1.0 mm greater than the die has been found to be sufficient to avoid ejecting the die from the recess during high speed rotation. This capability is conducive to exposure of the die to wet processing and spin drying. The advantages of exposing die to wet processing in a packaging process are described in related application U.S. Ser. No. 09/505,283, entitled "Method for Low Temperature Bonding and Bonded Structure" filed Feb. 16, 2000, the entire contents of which are incorporated herein by reference.

Figure 7A:
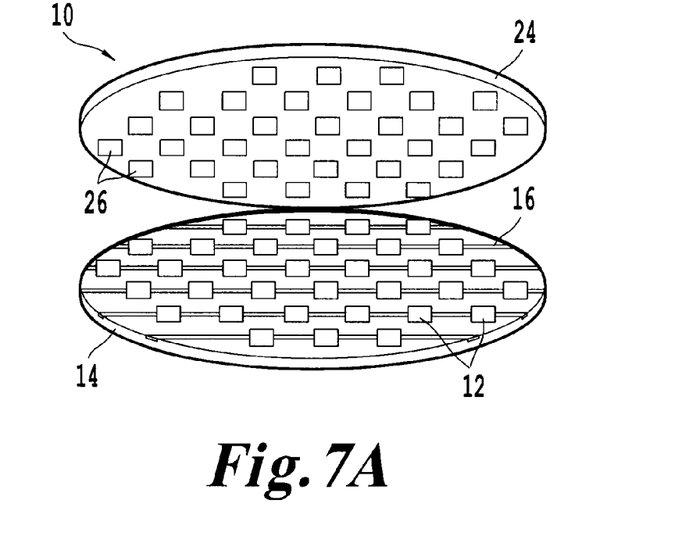
FIG. 7A is a schematic illustration of of a lid for the waffle pack device of the present invention.
Figure 7B:
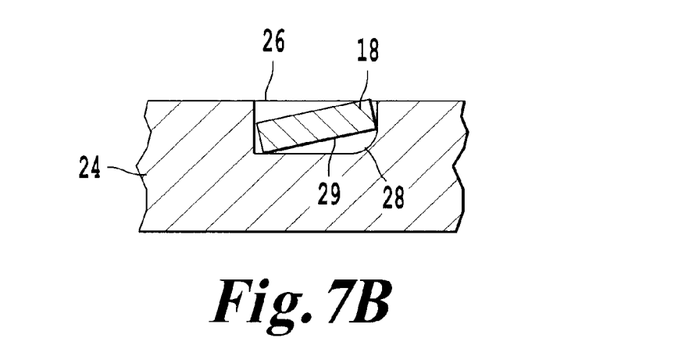
FIG. 7B is a schematic cross section of the lid of the present invention having mating recesses that restrict die movement.

The small difference in size between the die 18 and the recesses 12 also facilitates flipping the die in a manner that avoids the surfaces from being scratched. An example of this is shown in FIGS. 7A and 7B, where a lid 24 designed to mate with the member 14 is shown. The lid 24 has mating recesses 26 of preferably an approximate size and a lateral shape to allow the die to drop from the member 14 into the mating recesses 26 when the waffle pack device 10 is flipped. The lid 24 is preferably designed to prevent the surface of the die 18 from contacting the bottom of the mating recesses 26 so as to preclude any possibility of the lid 24 scratching the surface of the die 18. For example, the mating recesses 26 can have a rounded inside corner 28 of a high enough radius of curvature such that when the die 18 is inserted into the recess 26, an edge of the die 18 rests against the curvature, keeping the surface of the die 18 from touching the bottom of the mating recess 26.

In this configuration, a die 18 being carried in the waffle pack device 10 and having undergone wet chemical or dry chemical processing to prepare the top surface of the die (i.e. the upper surface of the die as shown in FIGS. 3 and 5) can be flipped by placing the lid 24 onto the member 14 and flipping the entirety of the waffle pack device 10 over. As shown in FIG. 7B, the die are deposited into the mating recesses 26 with the former top surface 29, i.e. the processed surface, for subsequent mounting or bonding to a mating surface, facing downwards, thus permitting a pick and place tool to remove the die from the mating recesses without contact or damage to the processed surface 29.

Figure 7C:
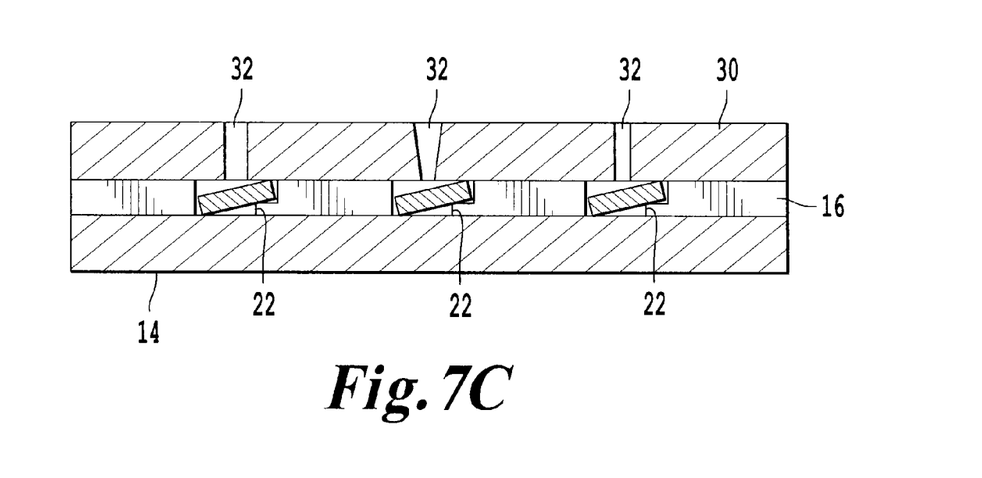
FIG. 7C is a schematic of a lid of the present invention having conduits to facilitate the processing of small die during wet processing.

Securing small die, typically less than 2-3 mm on a side, in a waffle pack device 10, for example when spin processing, can be accomplished with attaching a lid 30, as for example shown in FIG. 7C. The thickness of the lid 30 and the member 14 is preferably in a range of 0.5 to 2.0 mm in order for wafer processing tools to handle the waffle pack device with the lid without having to alter the wafer processing tool.

FIG. 7C depicts a lid 30 having a conduit 32 to facilitate the processing of small die by acting like a pump or injector for processing liquid during spinning. The lid 24 mates to the top of member 14 and effectively eliminates die ejection. As shown in FIG. 7C, the lid 24 is preferably designed with the conduit 32 above each mating recess 26. The conduit 32 serves as an injector or a pump for wet processing. The injecting or pumping action is induced by spinning of the waffle pack device 10 that reduces the pressure in the channels and draws wet process material through the conduit 32. The size of the conduit 32 is chosen large enough to allow wet process material to flow through the hole and small enough to restrain die from being ejected from the waffle pack. The lid thickness is preferably between 0.25 to 1.0 mm. The hole size and shape for the conduit 32 allows wet process material to flow through the conduit 30. Typically, an opening size of the conduit 32 will be between 20-95% of the die size. Further, the conduit 32 can be tapered such that a diameter at the top of the conduit away from the recess holding the die is greater than a diameter at the bottom of the conduit or alternatively the conduit can be tapered as shown in the center conduit 32 depicted in FIG. 7C.

The waffle pack device of the present invention can be used with a variety of types of die, including die of different technologies, i.e. silicon, III-V materials, II-VI materials, etc. Applications of the present invention include but are not limited to vertical integration of processed integrated circuits for 3-D SOC, micro-pad packaging, low-cost and high-performance replacement of flip chip bonding, wafer scale packaging, thermal management and unique device structures such as metal base devices.

Figure 8:
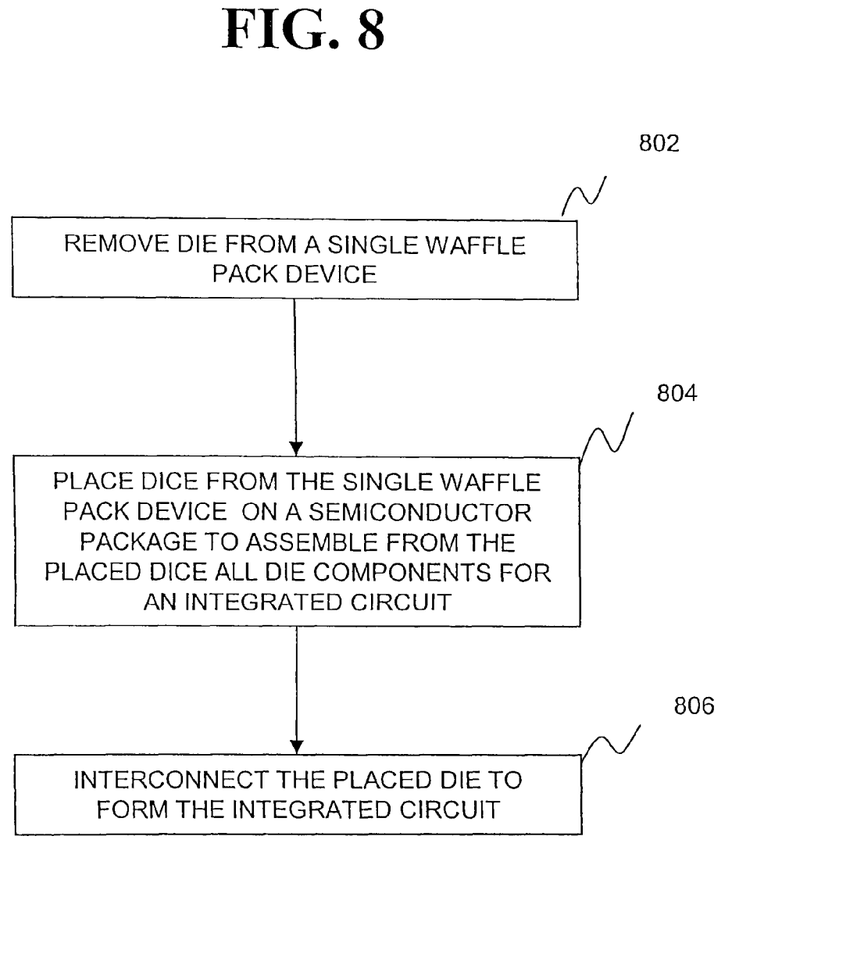
FIG. 8 is a flowchart depicting an illustrative assembly method of the present invention.

FIG. 8 is a flowchart depicting an illustrative assembly method of the present invention using the waffle pack device of the present invention to provide die for a semiconductor package assembly. In this method, as shown by step 802, die are removed from a single waffle pack device. In step 804, die from the single waffle pack device are placed on a semiconductor package to assemble from the placed die all die components required for an integrated circuit. In step 806, the die placed on the semiconductor package are electrically interconnected to form the integrated circuit. In a preferred embodiment of this method, the single waffle pack device includes all the die components required for the assembly of the integrated circuit.

In one aspect of the present invention, prior to step 802, the die are placed into respective recesses in the waffle pack device after having been cut from at least one die-including semiconductor wafer. Prior to step 804, the die in the waffle pack device can be subject to either wet or dry processing. Upon being subjected to a wet process, such as for example a wet chemical process or a washing, effluent from the wet process can be expelled from the die by rotating the waffle pack device to dispense of any liquid. After the wet process, the die in the waffle pack device can be heated to evaporate any liquid remaining from the wet process.

The step 806 involving electrically interconnecting the die to form an integrated circuit follows practices and procedures known in the art for integrated circuit fabrication.

Figure 9:
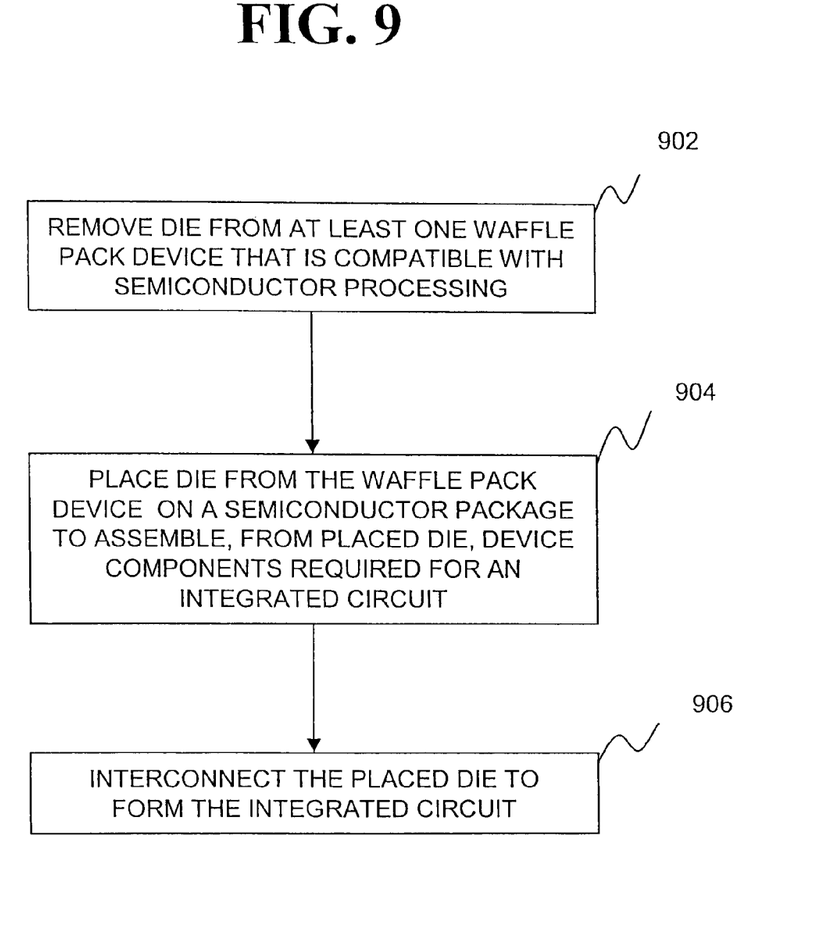
FIG. 9 is a flowchart depicting another illustrative assembly method of the present invention.

FIG. 9 is a flowchart depicting another illustrative assembly method of the present invention using the waffle pack device of the present invention to provide die for a semiconductor package assembly. In this method, as shown by step 902, die are removed from at least one waffle pack device, each waffle pack device being compatible with semiconductor wafer processing. In step 904, die from the waffle pack device(s) are placed on a semiconductor package to assemble, from the placed die, device components required for an integrated circuit. In step 906, the die placed on the semiconductor package are electrically interconnected to form the integrated circuit.

In one aspect of the present invention, prior to step 902, the die are placed into respective recesses in the waffle pack device(s) after having been cut from different die-including semiconductor wafers. Prior to step 904, the die in the waffle pack device(s) can be subject to either wet or dry processing. Upon being subjected to a wet process, such as for example a wet chemical process or a washing, effluent from the wet process can be expelled from the die by rotating the waffle pack device(s) to dispense of any liquid. After the wet process, the die in the waffle pack device(s) can be heated to evaporate any liquid remaining from the wet process. Step 906, like step 806, follows practices and procedures known in the art for integrated circuit fabrication.

Figure 10:
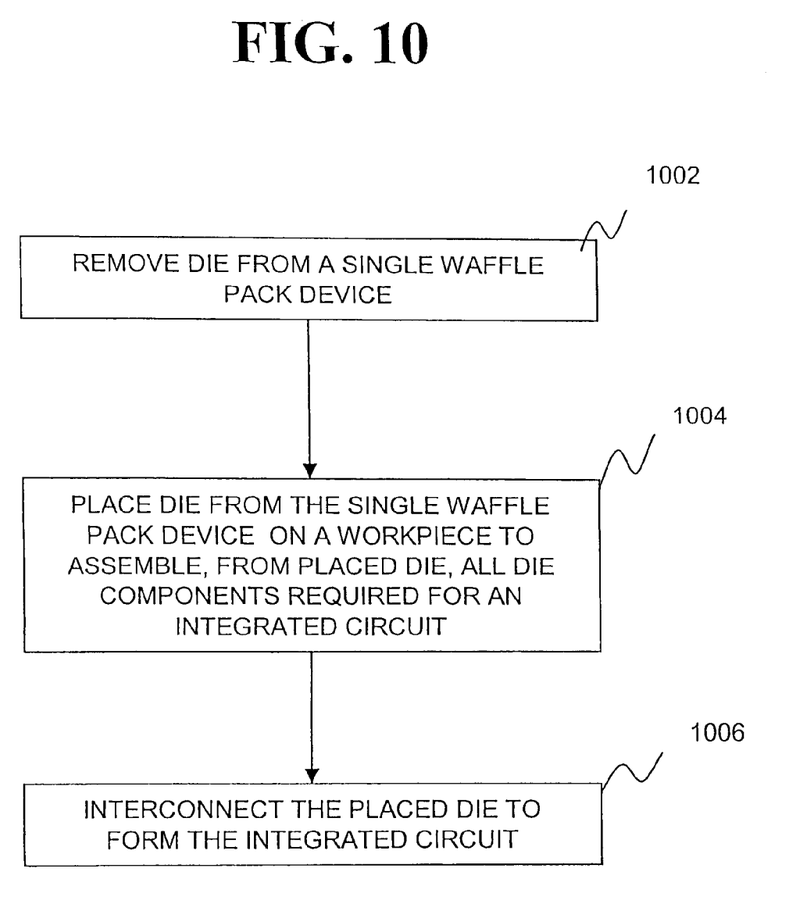
FIG. 10 is a flowchart depicting another illustrative assembly method of the present invention.

FIG. 10 is a flowchart depicting another illustrative assembly method of the present invention using the waffle pack device of the present invention to provide die for a semiconductor package assembly. In this method, as shown by step 1002, die are removed from a single waffle pack device. In step 1004, die from the waffle pack device is placed on a workpiece to assemble, from the placed die, all die components required for a circuit or an integrated circuit. More than one type or size of die may be present in the waffle pack and placed on the workpiece. In step 1006, the die placed on the semiconductor package are electrically interconnected to form the circuit or integrated circuit. In step 1004, the die can be placed on a semiconductor wafer including devices or integrated circuits. Further, as in the above-noted methods, prior to step 1002, the die are placed into respective recesses in the waffle pack device(s) after having been cut from a semiconductor wafer or wafers. Prior to step 1004, the die in the waffle pack device(s) can be subject to either wet or dry processing. Upon being subjected to a wet process, such as for example a wet chemical process or a washing, effluent from the wet process can be expelled from the die by rotating the single waffle pack device to dispense of any liquid. After the wet process, the die in the single waffle pack device can be heated to evaporate any liquid remaining from the wet process. Step 1006, like steps 806 and 906, follows practices and procedures known in the art for integrated circuit fabrication.

Numerous modifications and variations of the present invention are possible in light of the above teachings. It is therefore to be understood that within the scope of the appended claims, the invention may be practiced otherwise than as specifically described herein.

The invention claimed is:

1. A waffle pack device, comprising: a member including, recesses in a surface of said member,
said member comprising a material and at least one of a size and shape, compatible with semiconductor wafer processing,
wherein the recesses are configured to tilt die in the recesses about an axis normal to a face surface of the member.

2. The device of claim 1, wherein the material is compatible with wet wafer processing.

3. The device of claim 1, wherein the recesses are sized and shaped to hold semiconductor die.

4. The device of claim 1, wherein a number of said recesses is sufficient to accommodate at least a majority of die from a semiconductor wafer.

5. The device of claim 4, wherein said number is greater than 50.

6. The device of claim 4, wherein said number is at least one thousand.

7. The device of claim 1, wherein the recesses have lateral dimensions from 0.05 to 0.2 mm larger than lateral dimensions of die from a semiconductor wafer.

8. The device of claim 1, wherein the recesses have a depth up to 0.2 of a millimeter smaller or greater than a thickness of die from a semiconductor wafer.

9. The device of claim 1, wherein the recesses are configured to tilt the die toward a center-of-mass of the member.

10. The device of claim 9, wherein a tilt of said die in the recesses has a radial component of the tilt, directed toward one of the center of mass and a geometric center of said member,
said tilt having a tangential component disposed in a plane of said die and directed perpendicular to a line from a center of the die to one of the center of mass and the geometric center,
said radial component being greater in magnitude than the tangential component of the tilt.

11. The device of claim 9, wherein said recesses are configured to tilt each of a first plurality of said die disposed in a first section of said member with a first tilt, and tilt each of a second plurality of said die in a second section of said member with a second tilt different than said first tilt.

12. The device claim 9, wherein said first and second sections are quadrants.

13. The device of claim 1, wherein said member comprises at least one of a semiconductor, silicon oxide, silicon nitride, Al, Cu, W, and silicide.

14. A waffle pack device, comprising:
a member including,
recesses in a surface of said member,
said member comprising a material and at least one of a size and shape, compatible with semiconductor wafer processing,
wherein said recesses are configured to tilt a die disposed in the recesses, said tilt has a radial component directed toward one of the center of mass and a geometric center of said member
said tilt having a tangential component disposed in a plane of said die and directed perpendicular to a line from a center of the die to one of the center of mass and the geometric center,
said radial component being greater in magnitude than the tangential component of the tilt.

15. A waffle pack device, comprising:
a member including,
recesses in a surface of said member,
said member comprising a material and at least one of a size and shape, compatible with semiconductor wafer processing,
wherein the recesses comprise:
side walls;
a bottom surface connecting to said side walls; and
a ledge on a side of the bottom surface opposite a center of mass or center of the member.

16. A waffle pack device, comprising:
a member including,
recesses in a surface of said member,
said member comprising a material and at least one of a size and shape, compatible with semiconductor wafer processing; and
channels formed in said member.

17. The device of claim 16, wherein the member comprises a circular-shaped member, and the channels are disposed radially across the circular-shaped member.

18. The device of claim 16, wherein the member comprises a circular-shaped member, and the channels disposed on chords across the circular-shaped member.

19. The device of claim 16, wherein the channels are disposed adjacent to a side wall of the recesses.

20. The device of claim 16, wherein at least two of the channels connect to each of the recesses.

21. The device of claim 20, wherein the at least two channels are disposed on opposite sides of the recesses.

22. The device of claim 16, wherein the channels have a depth equal to or greater than a depth of the recesses.

23. A waffle pack device, comprising:
a member including,
recesses in a surface of said member,
said member comprising a material and at least one of a size and shape, compatible with semiconductor wafer processing,
a lid to cover said member, wherein the lid has a plurality of mating recesses.

24. The device of claim 23, wherein the mating recesses of the lid correspond in position to the recesses in the member.

25. The device of claim 23, wherein at least one of the plurality of mating recesses comprises:
side walls; and
a bottom surface having a curved portion connecting to one of said side walls.

26. The device of claim 23, wherein said mating recesses are configured to hold a die in a position to avoid contact between a planar surface of the die and a bottom surface of said mating recesses.

27. The device of claim 23, wherein the lid comprises a conduit connecting to the mating recesses.

28. A waffle pack device, comprising:
a member including,
recesses in a surface of said member,
said member comprising a material and at least one of a size and shape, compatible with semiconductor wafer processing,
wherein said member comprises a circular-shaped member.

29. The device of claim 28, wherein the member comprises an aluminum disk.

30. The device of claim 28, wherein the member comprises a silicon disk.

31. The device of claim 30, wherein said member comprises a silicon wafer including at least one of silicon oxide, silicon nitride, Al, Cu, W, and silicide.

32. The device of claim 28, wherein the member comprises a silicon-on-insulator structure.

33. The device of claim 32, wherein the silicon-on-insulator structure comprises:
a first silicon member;
a silicon oxide layer in contact with the first silicon member; and
a second silicon member in contact with the silicon oxide layer and including said recesses.

34. The device of claim 33, wherein said first silicon member comprises a silicon layer of a thickness of 0.5-1.0 mm, said silicon oxide layer has a thickness of 1-10 µm, and said second silicon member comprises a silicon wafer of a thickness of 50-500 µm.

35. The device of claim 28, wherein said circular-shaped member comprises: a member having a diameter of 100 mm.

36. The device of claim 28, wherein said circular-shaped member comprises: a member having a diameter of 200 mm.

37. The device of claim 28, wherein said member is circular with a diameter of 300 mm.

38. The device of claim 28, wherein a number of said recesses is sufficient to accommodate at least a majority of die from a semiconductor wafer.

39. The device of claim 38, wherein said number is greater than 50.

40. The device of claim 38, wherein said number is at least one thousand.

41. A waffle pack device, comprising:
a circular-shaped member being compatible with semiconductor wafer processing; and
recesses in a surface of said member.

42. The device of claim 41, wherein said circular-shaped member has a diameter of 100 mm.

43. The device of claim 41, wherein said circular-shaped member has a diameter of 200 mm.

44. The device of claim 41, wherein said circular-shaped member has a diameter of 300 mm.

45. The device of claim 41, wherein a number of said recesses is sufficient to accommodate at least a majority of die from a semiconductor wafer.

46. The device of claim 45, wherein said number is greater than 50.

47. The device of claim 45, wherein said number is at least one thousand.

48. A waffle pack device, comprising:
a member including,
recesses in a surface of said member,
said recesses configured to tilt die from a semiconductor wafer about an axis normal to a face surface of the member.

49. The device of claim 48, wherein the recesses are configured to tilt die placed in the recesses toward a center-of-mass of the member.

50. The device of claim 48, wherein said recesses are configured to tilt a die disposed in the recesses, said tilt has a radial component directed toward one of the center of mass and a geometric center of said member,
said tilt having a tangential component disposed in a plane of said die and directed perpendicular to a line from a center of the die to one of the center of mass and the geometric center,
said radial component being greater in magnitude than the tangential component of the tilt.

51. The device of claim 48, wherein a number of said recesses is sufficient to accommodate at least a majority of die from a semiconductor wafer.

52. The device of claim 51, wherein said number is greater than 50.

53. The device of claim 51, wherein said number is at least one thousand.

54. An apparatus for holding semiconductor die, comprising:
a carrier having recesses to accommodate said die; and
means for securing said die during rotation of said carrier such that said die are not expelled during said rotation located in said recesses,
wherein said means for securing comprises means for tilting said die in said recesses.

55. The apparatus of claim 54, wherein the means for tilting is configured to tilt the die toward a center-of-mass of the carrier.

56. The device of claim 54, wherein said recesses are configured to tilt a die disposed in the recesses, said tilt has a radial component directed toward one of the center of mass and a geometric center of said member,
said tilt having a tangential component disposed in a plane of said die and directed perpendicular to a line from a center of the die to one of the center of mass and the geometric center,
said radial component being greater in magnitude than the tangential component of the tilt.

57. The apparatus of claim 54, wherein said carrier is configured to be compatible with a semiconductor wafer processing tool, and
means for securing comprises a cover to secure said die in said carrier during said rotation of the carrier by said semiconductor processing tool.

* * * * *